(12) United States Patent
Kim et al.

(10) Patent No.: US 7,432,022 B2
(45) Date of Patent: Oct. 7, 2008

(54) PHOTO MASK CAPABLE OF IMPROVING RESOLUTION BY UTILIZING POLARIZATION OF LIGHT AND METHOD OF MANUFACTURING THE SAME

(75) Inventors: Sung-hyuck Kim, Suwon-si (KR); In-kyun Shin, Yongin-si (KR); Gi-sung Yoon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 775 days.

(21) Appl. No.: 10/942,047

(22) Filed: Sep. 16, 2004

(65) Prior Publication Data
US 2005/0123839 A1    Jun. 9, 2005

(30) Foreign Application Priority Data
Dec. 5, 2003    (KR) .................... 10-2003-0087981

(51) Int. Cl.
*G03F 1/00*    (2006.01)
(52) U.S. Cl. ............................................. 430/5
(58) Field of Classification Search ............. 430/5, 430/394; 378/35
See application file for complete search history.

(56) References Cited

U.S. PATENT DOCUMENTS

| 5,686,209 | A | * | 11/1997 | Iwamatsu et al. ............. 430/5 |
| 6,163,367 | A |  | 12/2000 | Obszarny |
| 7,090,948 | B2 | * | 8/2006 | Rau ............................. 430/5 |
| 2002/0195271 | A1 |  | 12/2002 | Gailus |
| 2006/0099517 | A1 | * | 5/2006 | Sugawara ..................... 430/5 |

FOREIGN PATENT DOCUMENTS

KR    1999-0028757    7/1999

* cited by examiner

*Primary Examiner*—Stephen Rosasco
(74) *Attorney, Agent, or Firm*—Volentine & Whitt, PLLC

(57) ABSTRACT

A photo mask enhances the resolution of a photolithography process by polarizing the exposure light. The photo mask includes a transparent substrate made of quartz, a reflection pattern disposed on the transparent substrate, and a light-blocking pattern disposed on the reflection pattern. The external reflection pattern defines a light-transmitting area by exposing portions of the transparent substrate. The light-blocking pattern has the same size and shape as the external reflection pattern.

13 Claims, 8 Drawing Sheets

(a) CASE OF BM (b) CASE OF PHOTO MASK ACCORDING TO THE PRESENT INVENTION

(a) CASE OF BM (b) CASE OF PHOTO MASK ACCORDING TO THE PRESENT INVENTION

FIG. 6

(a) CASE OF BM (b) CASE OF PHOTO MASK ACCORDING
TO THE PRESENT INVENTION

PHOTO MASK CAPABLE OF IMPROVING RESOLUTION BY UTILIZING POLARIZATION OF LIGHT AND METHOD OF MANUFACTURING THE SAME

BACKGROUND OF THE INVENTION

1. Field of the Invention

The present invention relates to the process of photolithography used in the manufacturing of semiconductor devices and the like. More particularly, the present invention relates to a photo mask and to a method of manufacturing the same.

2. Description of the Related Art

Process margins in the manufacturing of semiconductor devices are becoming smaller and smaller as the design rule of the devices has decreased to meet the demand for more highly integrated devices. One semiconductor manufacturing process that is being refined is photolithography. In photolithography, light of a given wavelength is directed from a light source onto a substrate through a photo mask such that an image of the photo mask is projected onto the substrate. The image is developed and exposed to form a pattern on the substrate. Conventionally, a KrF light source has been widely used as the light source, and a binary mask (BM) has been used as the photo mask. Binary masks comprise a quartz substrate having a chrome pattern thereon.

Recently, an ArF light source or an $F_2$ light source has been proposed as a substitute for a conventional KrF light source as a means of attaining a smaller margin for the photolithography process. However, many problems exist in the mass-production of ArF light sources and the like. Therefore, Resolution Enhancement Technologies (RETs) are actively being developed which enable fine patterns to be formed using existing light sources, such as the conventional KrF light sources.

Among these RETs is a photolithographic process that uses a phase shift mask (PSM) instead of the conventional binary mask (BM). A PSM induces a phase shift in the light being transmitted therethrough to enhance the resolution of the photolithograph process. A PSM may be classified as an ALT-PSM (alternating-PSM), a rim-shift-PSM, an attenuated PSM (hereinafter, referred to as attPSM) or a half-tone PSM. An ALT-PSM (alternating-PSM) comprises a quartz substrate, and phase shifters in the form of film portions or recesses spaced from one another by a predetermined distance on a light-transmitting area of the quartz substrate. A rim-shift-PSM comprises a light-blocking pattern made of chrome, and phase shifters in the form of film patterns formed on the light-blocking pattern. An attPSM or a half-tone PSM comprises a half-tone film instead of the light-blocking pattern or a film of Mo applied to a conventional BM.

Currently, the attPSM is the most widely used type of PSM in photolithography. However, the film constituting the phase shifter of the attPSM has a transmissibility of only 5 to 20%. Therefore, a so-called side lobe is produced. This problem can be prevented by employing an additional light-blocking pattern. Nonetheless, such a light-blocking pattern requires an additional process that increases the Turn Around Time (TAT) for manufacturing the mask. Also, an Mo film causes a haze to develop on the mask. The haze is not present during the first few series of processes, but abruptly develops over the entire surface of the attPSM once the processes have been repeated a number of times, even to the point where the process yield is 0%. Therefore, an attPSM must be periodically cleaned to prevent haze. However, it is impossible to completely prevent a haze from eventually developing on an attPSM.

For these reasons, current studies into improving the resolution in photolithography have centered around the use conventional BMs made of quartz and chrome. Among the photo masks being studied in this respect are polarized masks (referred to hereinafter as "PMs"). A polarized mask (PM) has a chrome pattern that is thicker than that of a conventional BM or light-transmitting areas that are narrower than those of a conventional BM. The PM enhances the resolution of the photolithography process by transmitting the incident light, made up of TEM (Transverse Electric and Magnetic) waves, at a relatively high polarization ratio (the ratio of the intensity of the transverse electric (TE) waves to the intensity of the transverse magnetic (TM) waves). Because the relatively thick chrome pattern or the closely spaced portions of the chrome pattern of a PM absorb the TM waves very well, the chrome pattern is also referred to as an absorbing layer in a PM.

Figure 1A:
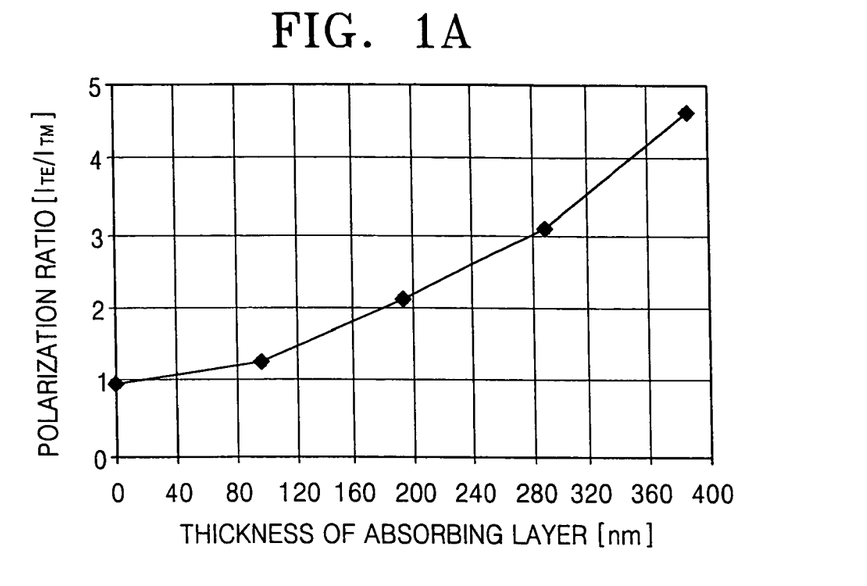
FIG. 1A is a graph showing changes in the polarization ratio (intensity of TE waves to intensity of TM waves) according to changes in the thickness of an absorbing layer, characteristic of a polarizing photo mask (PM)

FIG. 1A shows the change in ratio of the intensity of TE waves to the intensity of TM waves according to changes in the thickness of the absorbing layer. Referring to FIG. 1A, as the absorbing layer becomes thicker, the ratio increases. Accordingly, the absorbing layer should be as thick as possible to enhance the resolution of the photolithography process as much as possible. However, making the absorbing layer thick complicates the manufacturing process of the photo mask.

Figure 1B:
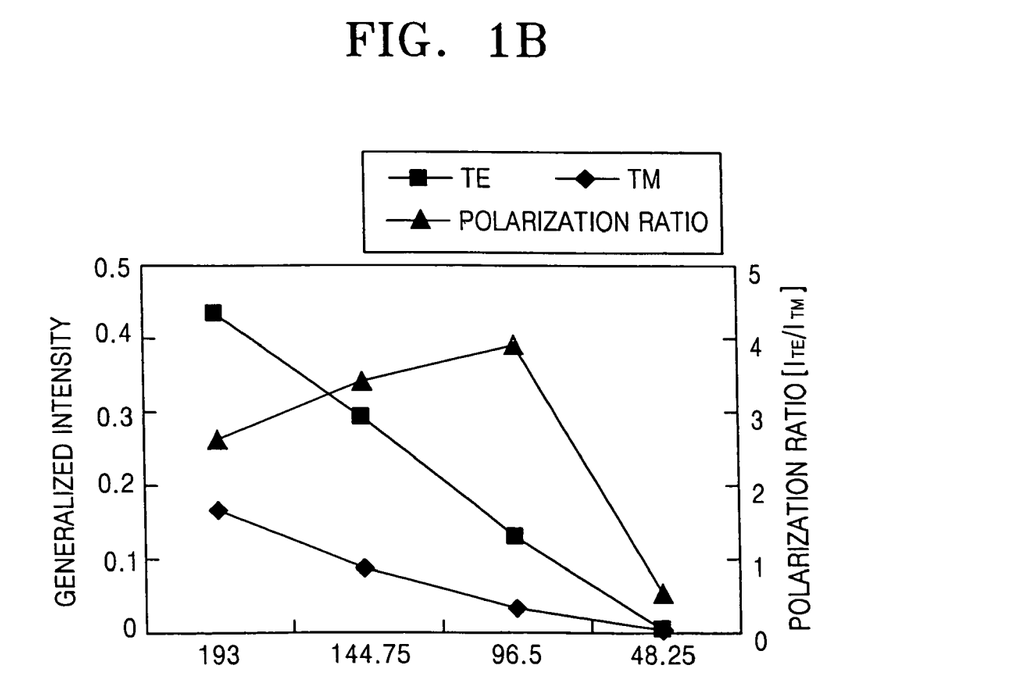
FIG. 1B is a graph showing changes in the polarization ratio according to changes in the pitch of a light-transmitting area, characteristic of a polarizing photo mask (PM)

FIG. 1B shows the intensity of the TM waves, the intensity of the TE waves and the polarization ratio according to changes in the pitch of the light-transmitting area. Referring to FIG. 1B, the polarization ratio continuously increases as the pitch of the light-transmitting area decreases, and sharply decreases when the polarization ratio exceeds a critical value (96.5 nm in FIG. 1B). Accordingly, the pitch of the light-transmitting area should be set at the critical value for the photo mask to enhance the resolution of the photolithography process to the maximum extent possible. However, the pitch of the light-transmitting area is limited by the design rule and/or a shape of the pattern to be formed on the substrate. Thus, it is difficult to use the critical value in designing PMs for mass-production.

SUMMARY OF THE INVENTION

An object of the present invention is to provide a photo mask that can enhance the resolution of a photolithography process by transmitting exposure light at a high polarization ratio.

Another object of the present invention is to provide a relatively simple method of manufacturing a polarization photo mask.

The photo mask according to the present invention provides a high degree of contrast in the image transmitted thereby by minimizing the minimum intensity of the light incident on the photo mask. The contrast of an image can be expressed by the following equation 1.

$$\text{contrast} = \frac{I_{max} - I_{min}}{I_{max} + I_{min}} = \frac{1 - I_{min}/I_{max}}{1 + I_{min}/I_{max}} \quad (1)$$

Referring to equation 1, it can be seen that reducing the ratio of the minimum intensity $I_{min}$ to the maximum intensity $I_{max}$ of the light increases the contrast of the image.

The incident light output from a light source in an exposure process is in the form of TEM waves, which include TE waves and TM waves. The TM wave is known as the component that limits the contrast of the resulting image because of its rather high minimum intensity in the transmitted light. That is, the greater the proportion of the TM waves is in the transmitted light, the greater is the minimum intensity of the light, and the smaller is the ratio of the minimum intensity $I_{min}$ to the maximum intensity $I_{max}$ of the light. As a result, the contrast of the image is lower and hence, the resolution of the exposure process is poorer. The present invention makes use of a difference between a reflectivity of the TE waves and a reflectivity of the TM waves to transmit light in which the minimum intensity is relatively small, thereby enhancing the contrast of the image.

According to an aspect of the present invention, there is provided a photo mask including: a transparent substrate, a reflection pattern formed on the transparent substrate so that the transparent substrate is exposed in correspondence with the reflection pattern, and a light-blocking pattern formed on the reflection pattern wherein the size and shape of the light-blocking pattern are the same as those of the reflection pattern. The polarization phenomenon produced by the photo mask is maximal because side walls of the reflection pattern and side walls of the light-blocking pattern are located along the same line perpendicular to the exposed surface of the transparent substrate.

Also, the reflection pattern can be thinner than that of the film of phase shift material in a PSM because the present invention utilizes a difference in reflectivity between the TE waves and the TM waves instead of having to produce a phase shift. In fact, the thickness of the reflection pattern can be smaller than that of the wavelength of the light emitted by the light source. Also, the thickness of a PSM is dictated by phase shift material used. However, the of the reflection pattern of the photo mask according to the present invention can be formed to any thickness that will provide maximum contrast.

The reflection pattern is made of material that is less reflective with respect to the transverse magnetic (TM) waves of said light of a given wavelength than with respect to the transverse electric (TE) waves of said light. For example, the reflection pattern is made of SOG. Preferably, the transparent substrate is made of quartz and the light-blocking pattern is made of chrome.

Also, the reflection pattern is formed to a predetermined thickness based on the type of light source (wavelength of the exposure light) that it will be employed with, and the pitch and shape of the pattern thereof. For example, if the light source is a KrF light source and the reflection pattern is a hole-shaped pattern, the thickness of the reflection pattern is 60 to 200 nm.

According to another aspect of the present invention, there is provided a method of manufacturing a photo mask, comprising: providing a transparent substrate, forming a reflection pattern on the transparent substrate so that the transparent substrate is exposed in correspondence with the reflection pattern, and forming a light-blocking pattern on the external reflection pattern in such a manner that the light-blocking pattern has the same pattern as the reflection pattern.

The forming of the reflection pattern and the forming of the light-blocking pattern are carried out as follows. A first film of material and a second film of material are sequentially formed on the transparent substrate. Next, a photoresist pattern is formed on the second film. The second film is etched using the photoresist pattern as an etching mask to form the light-blocking pattern. Then the photoresist pattern is removed. Finally, the first film is etched using the light-blocking pattern as an etching mask to form the reflection pattern.

BRIEF DESCRIPTION OF THE DRAWINGS

The above and other features and advantages of the present invention will become more apparent from the following detailed description of the preferred embodiments thereof made with reference to the attached drawings in which.

DETAILED DESCRIPTION OF THE PREFERRED EMBODIMENTS

The preferred embodiments of the present invention will be described hereinafter in detail with reference to the accompanying drawings. It should be noted, though, that the thickness of layers may be exaggerated in the drawings for clarity. Also, the same reference numerals are used to denote the same elements throughout the drawings.

In an exposure process of photolithography, the exposure light emitted from a light source passes through air onto a photo mask, propagates through the transparent substrate of a photo mask, and then passes through air to the substrate (e.g., wafer) that is to be patterned. The transparent substrate of the photo mask is generally made of quartz. Air and quartz have different indices of refraction. Accordingly, some of the light is reflected at the boundary between the air and the transparent substrate, while the remainder of the light is transmitted while being refracted.

Figure 2:
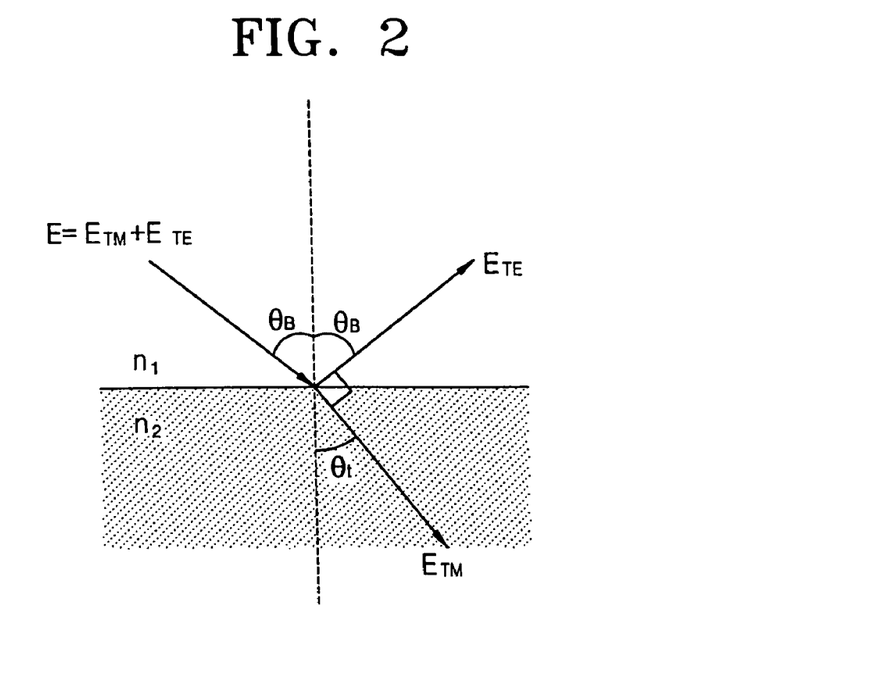
FIG. 2 is a conceptual diagram showing the path of light incident on a medium at Brewster's angle.

Also, when light passes through two mediums having different indices of refraction, the reflectivity and transmissibility of the light depend on the angle at which the light is incident at the boundary of the two mediums. In particular, there is an angle of incidence at which 0% of the TM waves are reflected at the boundary, as shown in FIG. 2. The angle of incidence at which the 0% of the TM waves are reflected is known as Brewster's angle ($\theta_B$). Brewster's angle is also referred to as the polarization angle because the reflected light includes only TE waves and accordingly, the reflected light is completely polarized. Referring still to FIG. 2, a condition in which the reflected light is completely polarized is one in which the sum of the angle of incidence $\theta_B$ and the angle of refraction $\theta_t$ is 90°.

Also, Brewster's angle can be expressed by the following equation 2, considering Snell's law and the condition described above at which polarization of the reflected light occurs:

$$n_1 \sin\theta_B = n_2 \sin\theta_t \quad (2)$$
$$n_1 \sin\theta_B = n_2 \sin(90 - \theta_B)$$
$$n_1 \sin\theta_B = n_2 \cos\theta_B$$
$$\tan\theta_B = \frac{n_2}{n_1}$$
$$\theta_B = \tan^{-1}\left(\frac{n_2}{n_1}\right)$$

wherein $n_1$ is the index of a refraction of the first medium and $n_2$ is the index of refraction of the second medium. According to equation 2, if the first medium is quartz ($n_1$=1.51) and the second medium is air ($n_2$=1), Brewster's angle is about 33.46°. On the other hand, if the first medium is air and the second medium is quartz, Brewster's angle $\theta_B$ is about 56.54°.

Figure 3:
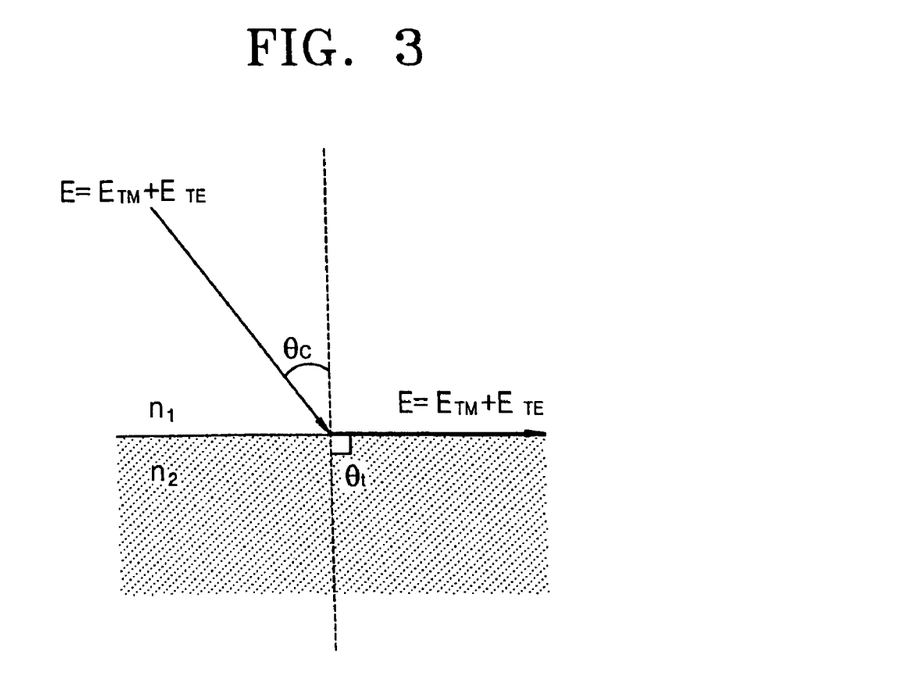
FIG. 3 is a conceptual diagram showing the path of light incident on a medium at an angle at which the incident light is totally reflected.

Also, an angle of incidence exists where there is no reflection or transmission, as shown in FIG. 3. Such an angle of incidence is referred to as the critical angle ($\theta_C$). If the angle of incidence is greater than the critical angle $\theta_C$, total internal reflection occurs. Referring to FIG. 3, the critical angle $\theta_C$ can be expressed by the following equation 3, according to Snell's law and considering that the angle of refraction is 90° when the angle of incidence equals the critical angle $\theta_C$:

$$n_1 \sin\theta_C = n_2 \sin\theta_t \quad (3)$$
$$n_1 \sin\theta_C = n_2$$
$$\sin\theta_C = \frac{n_2}{n_1}$$
$$\theta_C = \sin^{-1}\left(\frac{n_2}{n_1}\right)$$

wherein $n_1$ is the index of refraction of the first medium and $n_2$ is the index of refraction of the second medium. According to equation 3, if the first medium is quartz ($n_1$=1.51) and the second medium is air ($n_2$=1), the critical angle $\theta_C$ is about 41.37°.

Figure 4A:
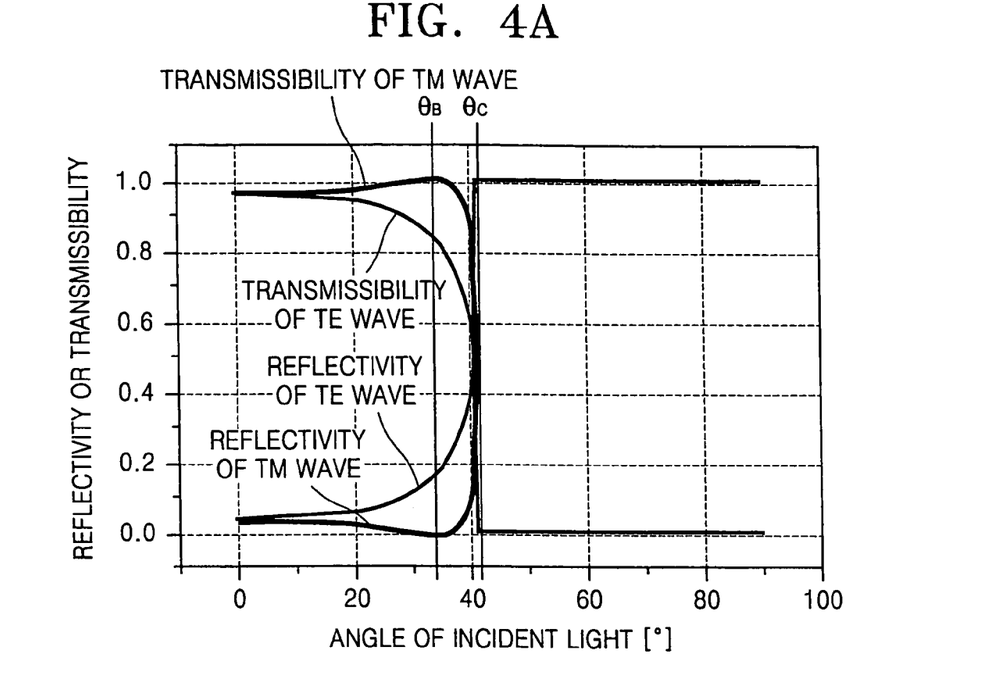
FIG. 4A is a graph showing a reflectivity and transmissibility of a TE wave and a reflectivity and transmissibility of a TM wave, according to changes in the angle of incidence of light propagating through a first medium having a relatively high index of refraction to a second medium having a lower index of refraction.
Figure 4B:
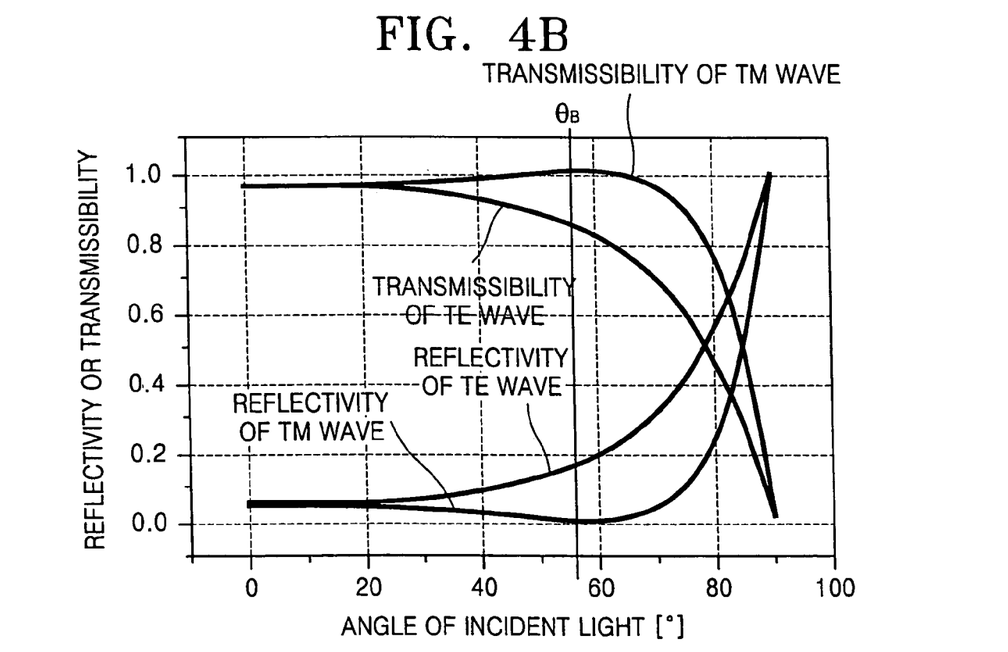
FIG. 4B is a graph showing a reflectivity and transmissibility of a TE wave and a reflectivity and transmissibility of a TM wave, according to changes in the angle of incidence of light propagating through a first medium having a relatively low index of refraction to a second medium having a higher index of refraction.

FIG. 4A is a graph showing the reflectivity and transmissibility of TE and TM waves, according to changes in the angle of incidence when the light is propagating from a first medium having a relatively high index of refraction to a second medium having a lower index of refraction. FIG. 4B is a graph showing the reflectivity and transmissibility of the TE and TM waves, according to changes in the angle of incidence when the light is propagating from the second medium to the first medium. In particular, in the case of FIGS. 4A and 4B, the first medium having the relatively high index of refraction is quartz and the second medium having the relatively low index of refraction is air. FIGS. 4A and 4B clearly show that the reflectivity of both the TM and TE waves change according to changes in the angle of incidence. Also, if the angle of incidence is Brewster's angle or close to Brewster's angle, the TM waves are transmitted without reflection.

The present invention utilizes the difference between the reflectivity of the TE and TM waves. In particular, according to the present invention, the intensity of the TM waves of the incident light passing through the photo mask is less than that of the TE waves of the incident light when the angle of incidence is Brewster's angle or close to Brewster's angle. As will be explained in more detail below, the contrast of the light transmitted to the wafer and the resolution of the image projected onto the wafer are thus enhanced.

Figure 5:
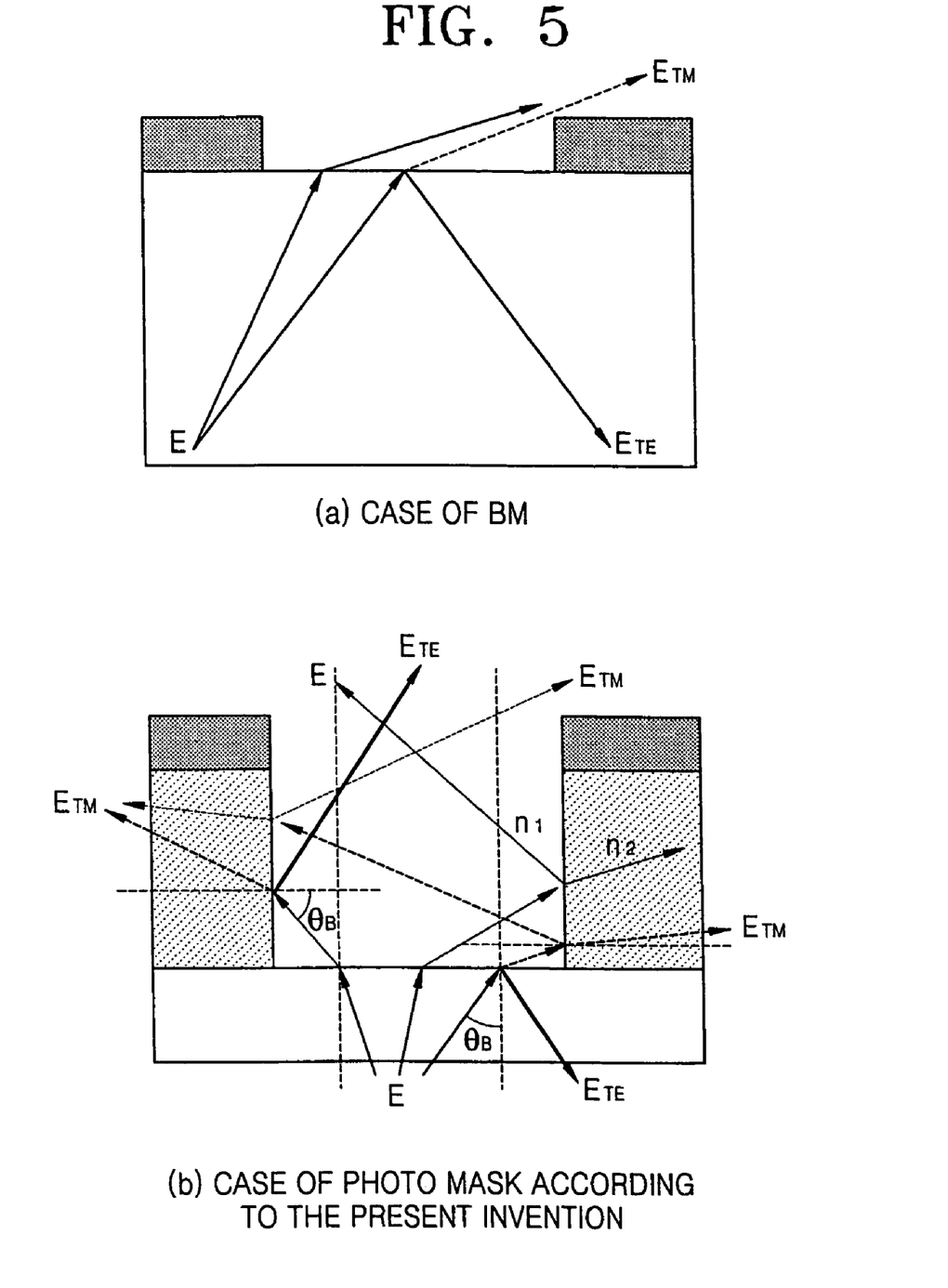
FIG. 5 is a pair of conceptual diagrams showing the path of light path when a conventional BM is used and when a photo mask according to the present invention is used, respectively.

FIG. 5 shows the path of incident light when a conventional BM is used and the path of incident light when the photo mask according to the present invention is used, respectively. When the conventional BM is used as shown at (a), most of TM waves of the incident light are transferred to the wafer. That is, the intensity of the TM waves is hardly changed. On the other hand, according to the present invention as shown at (b) in FIG. 5, a reflection pattern having a predetermined thickness is interposed between the transparent substrate and the light-blocking pattern. Accordingly, the light passing through the transparent substrate is reflected at the side wall of the reflection pattern. In this case, the reflected light comprises a higher proportion of the TE waves, whereby the minimum intensity of the incident light is reduced and the contrast is improved. Therefore, the resolution is enhanced.

EXPERIMENTAL EXAMPLE 1

Figure 6:
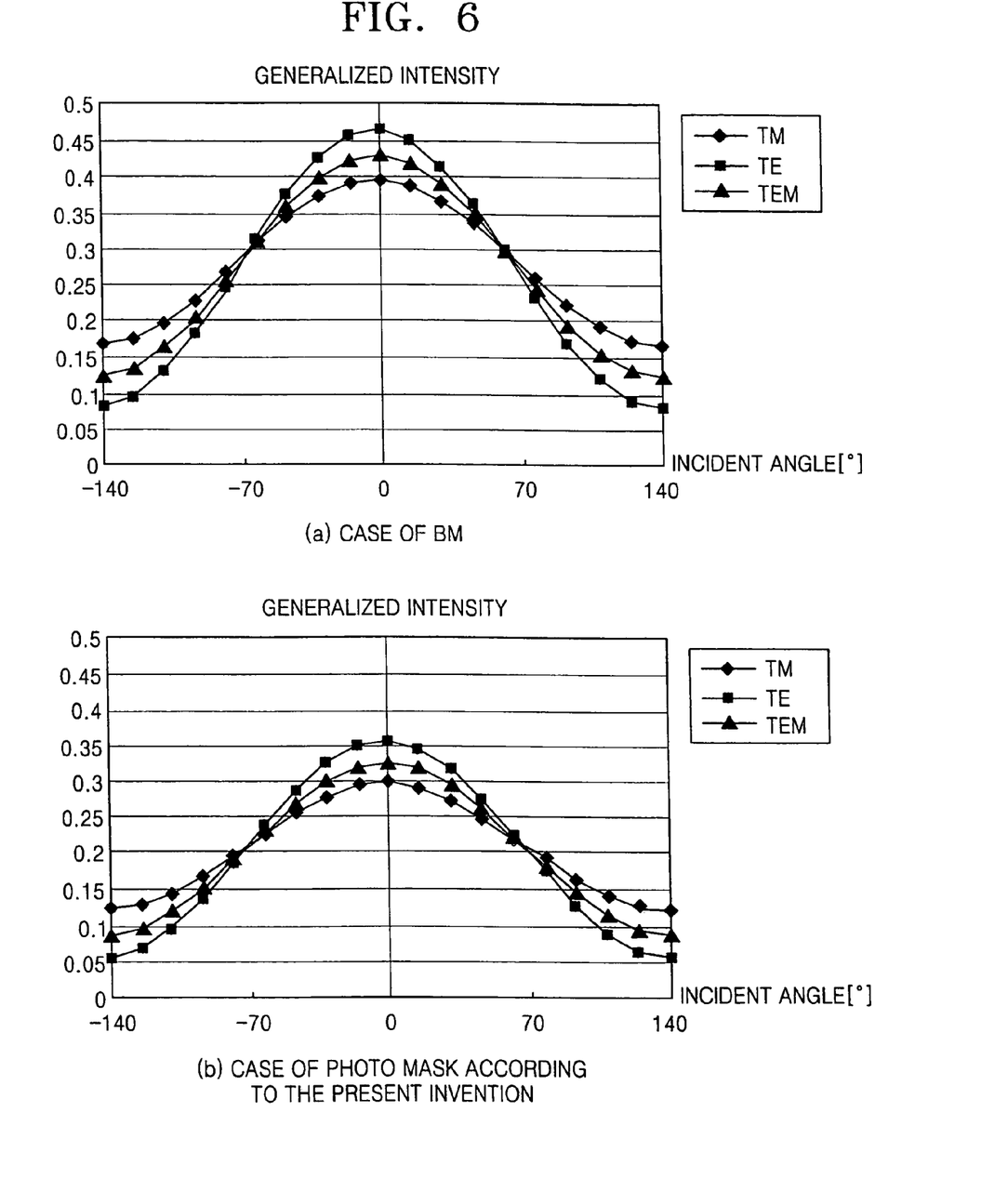
FIG. 6 is a pair of graphs showing intensity changes in a TE wave, TM wave and TEM wave in simulations of using the conventional BM photo mask according to the present invention, respectively.

Hereinafter, changes in contrast according to changes in the thickness of the external reflection pattern will be described with reference to simulations, the results of which are shown in FIG. 6. Graph (a) of FIG. 6 shows generalized intensity changes of a TE wave, a TM wave and a TEM wave obtained through a simulation in which a conventional BM is used. Graph (b) of FIG. 6 shows generalized intensity changes of a TE wave, a TM wave and a TEM wave obtained through a simulation in which a photo mask including a reflection pattern having a thickness of 240 nm according to the present invention is used. The simulations were carried out using a lens with a numerical aperture (NA) of 0.8, an annular aperture of 0.59/0.89 and a line and space pattern of 140 nm. The reflection pattern is made of SOG, the transparent substrate is a quartz substrate, and the light-blocking pattern is a chrome pattern.

Figure 7:
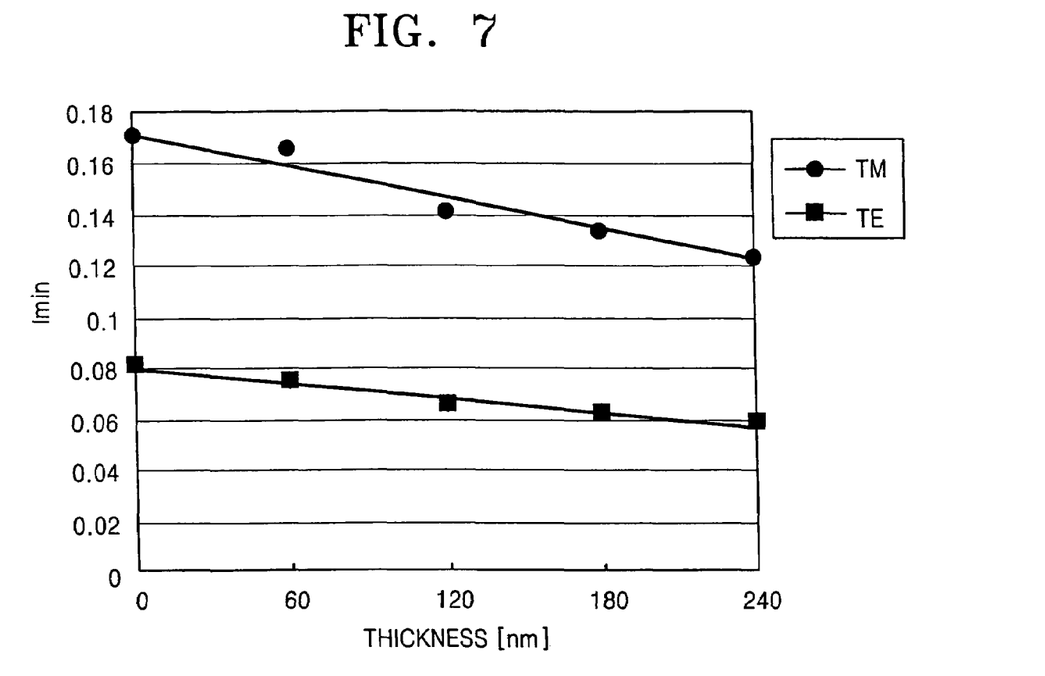
FIG. 7 is a graph showing minimum intensity changes of the TE and TM waves, according to changes in the thickness of an SOG film used as a reflection layer in the photo mask according to the present invention.

In the case of the BM, the TM wave has a lower maximum intensity and a higher minimum intensity than the TE wave. This is the same as in the case of using the photo mask according to the present invention. Also, in the case of the latter, the intensity of the TEM wave is generally less than in the case of using the BM, and likewise the intensities of both the TE wave and TM wave constituting the TEM wave are less. However, in a photo mask including an SOG film, the reduction ratio of the intensity of the TM wave is greater than that of the TE wave. This is shown in detail in FIG. 7. FIG. 7 shows the minimum intensities of the TE wave and the TM wave according to the thickness of the SOG film. Referring to FIG. 7, for example, if the thickness of the SOG film is 240 nm, the reduction ratio of the intensity of the TE wave is 25% but the reduction ratio of the intensity of the TM wave is 34%. This is because some of the TE waves are reflected by the SOG film when the angle of incidence of the light is close to Brewster's angle, whereas most of the TM waves are absorbed by the light-blocking pattern without being reflected.

However, contrast is dictated by the ratio of minimum to maximum intensities, the minimum intensity is mainly established by the TM wave, and the SOG pattern reduces the TM waves that are transmitted by the photo mask. Therefore, a photo mask comprising an SOG pattern, as a reflection pattern between the transparent substrate and light-blocking pattern, increases the contrast and enhances the resolution in comparison with a corresponding photo mask that only includes the transparent substrate and light-blocking pattern.

EXPERIMENTAL EXAMPLE 2

Figure 8:
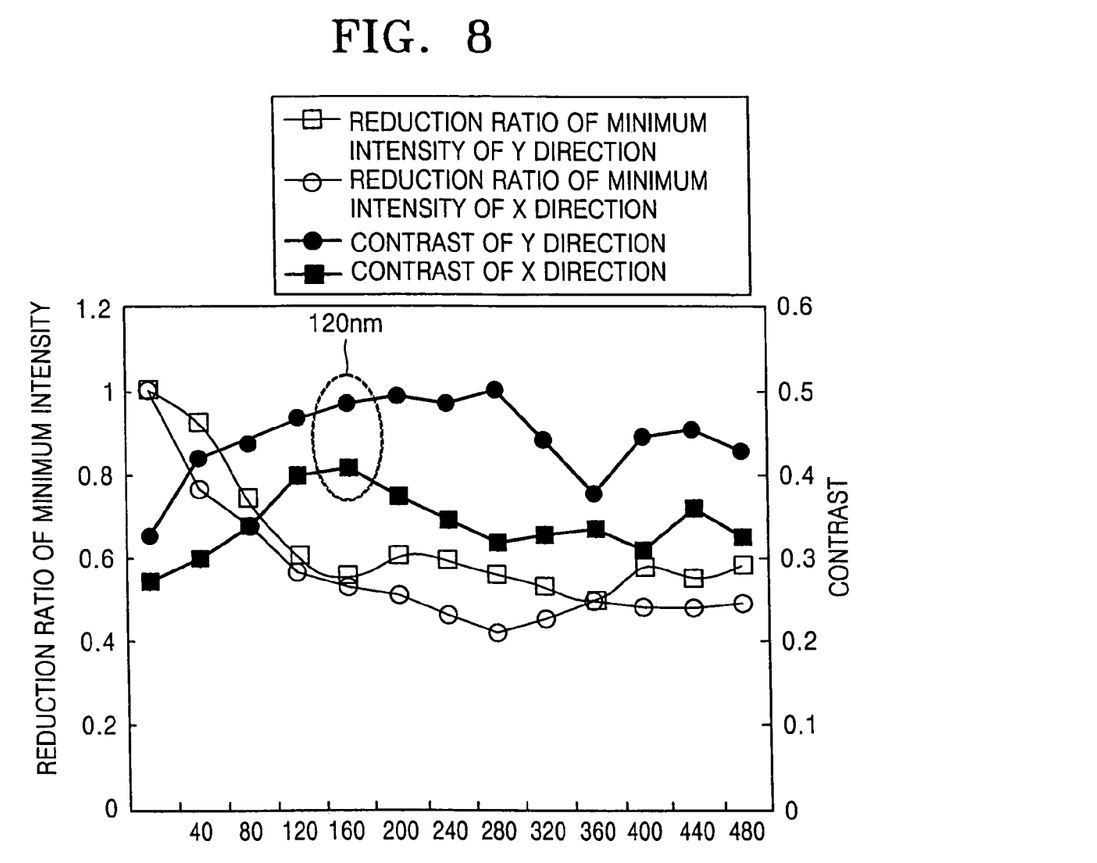
FIG. 8 is a graph showing a reduction ratio change in the minimum intensity and a corresponding contrast change, according to changes in the thickness of a reflection layer having a hole-shaped pattern with a pitch of 140 nm.

FIG. 8 is a graph showing changes in the reduction ratio of minimum intensity and corresponding changes in contrast, according to changes in the thickness of a SOG pattern, with respect to a pattern having a pitch of 140 nm. The conditions of this simulation are the same as in Experimental Example 1 except that the pattern is a hole-shaped contact pattern.

Referring to FIG. 8, the reduction ratios of the minimum intensity, with respect to an X direction and a Y direction perpendicular to the X direction, decrease as the SOG pattern becomes thinner, and become nearly constant once the thickness exceeds about 120 nm. Accordingly, FIG. 8 shows that the contrast becomes maximum when the thickness of the SOG pattern is 120 nm. Also, FIG. 8 shows that enhanced contrast is achieved when the SOG pattern is thinner than 240 nm (the thickness of a phase shift film). This is because with respect to a contact pattern, the reflection pattern would be formed on four sides in the light-transmitting area. That is, a maximum contrast is obtained when the SOG pattern is relatively thin because the light would be subjected to polarization at all four sides of the SOG pattern. Therefore, in the photo mask according to the present invention, the reflection pattern should be formed to a thickness based on the shape of a pattern as well as the size of the pattern in order to provide a relatively high resolution in the photolithography process for forming the pattern.

Figure 9:
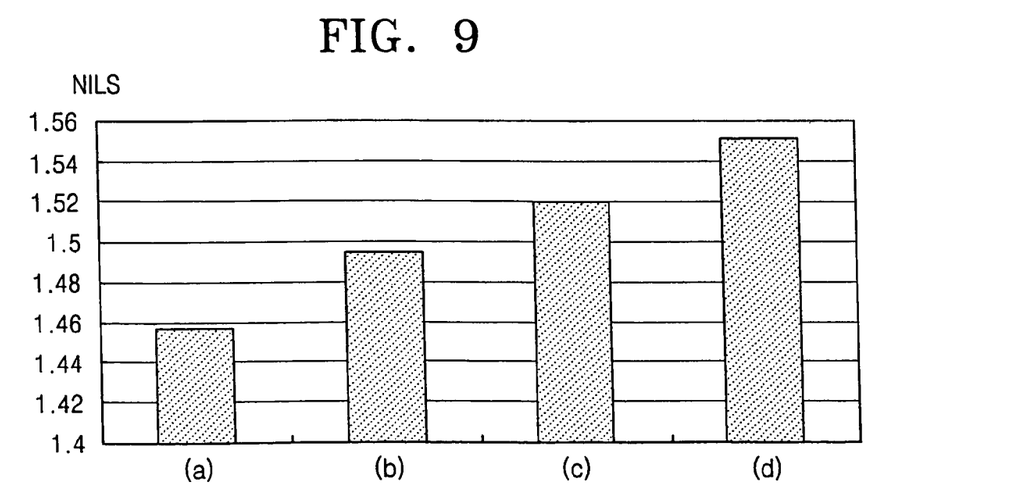
FIG. 9 is a chart of the image log slops (NILS) for conventional photo masks and the photo mask according to a present invention, respectively.

FIG. 9 shows generalized image log slops (NILS) for the conventional photo mask and the photo mask according to the present invention, respectively. In FIG. 9, (a) shows the case of a conventional BM with a chrome pattern having a thickness of 700 Å, (b) shows the case of a conventional BM with a chrome pattern having a thickness of 3000 Å, according to the prior art, (c) shows the case of a conventional BM in which the pitch of a light-transmitting area defined by a chrome pattern is 20 nm less than in the case of (a), and (d) shows the case of a photo mask according to the present invention in which a SOG pattern having a thickness of 240 nm is added to the BM of (a). Referring to FIG. 9, it is seen that the NILS value increases as the thickness of the chrome pattern increases or as the pitch of the light-transmitting area decreases. Also, it will be understood in FIG. 9 that the NILS value is greatest for the photo mask according to the present invention.

Figure 10A:
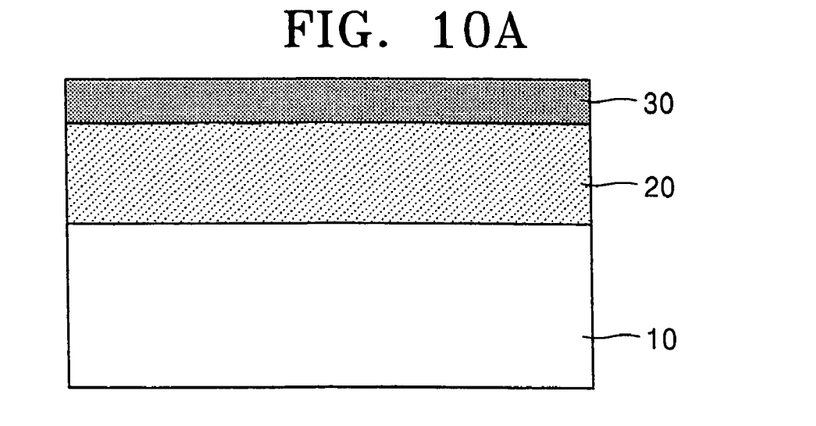
FIGS. 10A through 10C are sectional views of a substrate showing a method of manufacturing a photo mask according to the present invention.
Figure 10B:
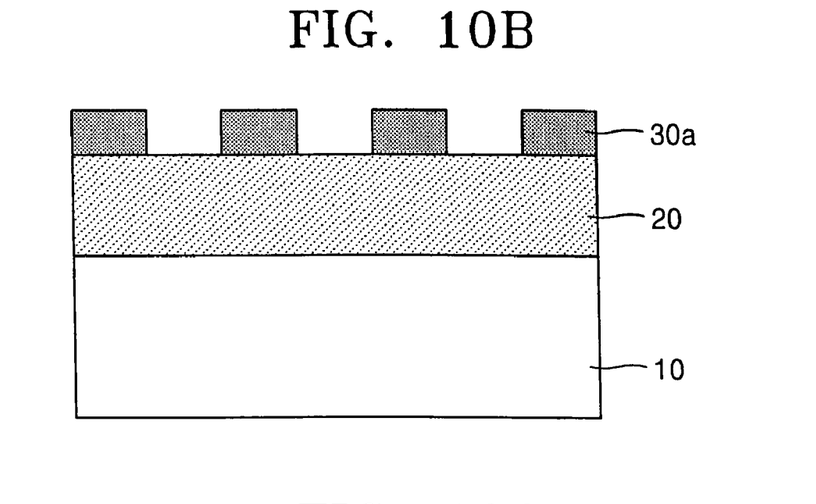
Figure 10C:
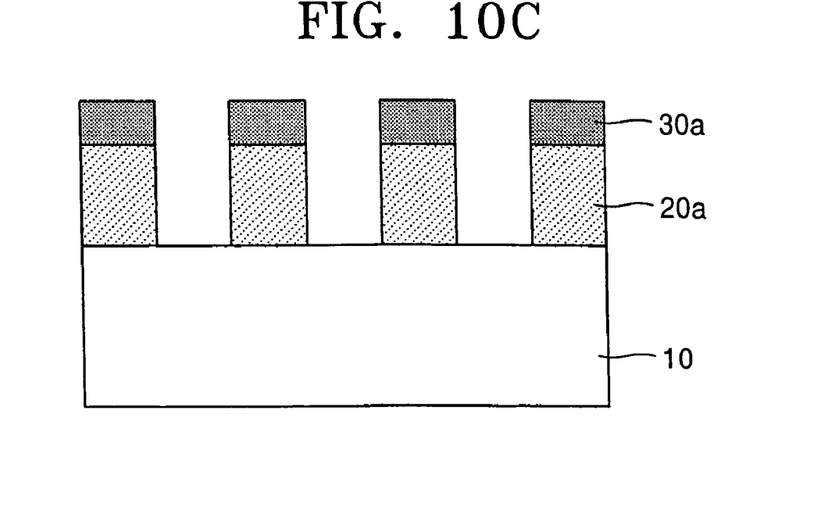

FIGS. 10A through 10C are sectional views for sequentially explaining a method for manufacturing a photo mask according to an embodiment of the present invention.

Referring to FIG. 10A, a film 20 for forming a reflection pattern is formed on a transparent substrate 10 and then a film 30 for forming a light-blocking pattern is formed thereon. The transparent substrate 10 is typically a quartz substrate. The reflective film 20 can be made of material (for example, SOG) that will reflect a greater proportion of the TE waves among the TE and TM waves of incident TEM light waves. The film 20 is formed to an appropriate thickness considering the design rule or pattern to be formed on the wafer, for example, so that maximum contrast can be obtained in the image used to form the pattern. The light-blocking film 30, on the other hand, is typically made of chrome.

Referring to FIG. 10B, the light-blocking film 30 is patterned using a photolithography process to form a light-blocking pattern 30a. The size and shape of the light-blocking pattern 30a will depend on the design rule and shape of the pattern to be formed on the wafer.

Referring to FIG. 10C, the reflective film 20 is patterned to thereby form a reflection pattern 20a. In this step, the film 20 is patterned using the light-blocking pattern 30a as an etching mask and without using a photoresist. Accordingly, the size and shape of the reflection pattern 20a are the same as those of the light-blocking pattern 30a. Furthermore, the manufacturing cost of the photo mask is minimal and the time required to manufacture the mask is relatively short because an additional photoresist is not used to form the reflection pattern 20a.

As described above, a photo mask according to the present invention comprises a reflection pattern interposed between a transparent substrate and a light-blocking pattern wherein the reflection pattern has the same size and shape as the light-blocking pattern. Due to the reflection pattern, most of the TE waves of the incident light are reflected and transferred to a wafer, whereas most of the TM waves of the incident light are refracted by the reflection pattern and absorbed by the light-blocking pattern. As a result, the ratio of minimum to maximum intensities of the incident light can be reduced.

Accordingly, the contrast of the light transmitted to a wafer is enhanced by polarization. Thus, it is possible to produce a high degree of resolution in a photolithography process using an existing light source and photoresist material.

Also, the photo mask according to the present invention can be manufactured by a simple manufacturing process. Therefore, the method of manufacturing the photo mask according to the present invention can be carried out a low cost and in a relatively short amount of time.

Finally, although the present invention has been particularly shown and described with reference to the preferred embodiments thereof, it will be understood that various changes in form and details may be made thereto without departing from the true spirit and scope of the present invention as defined by the following claims.

What is claimed is:

1. A photo mask including:
   a substrate tat is transparent to an exposure light of a given wavelength;
   a reflection pattern disposed on the transparent substrate such that portions of the transparent substrate are exposed in correspondence with the pattern, said reflection pattern comprising a pattern of material that is reflective with respect to said light of a given wavelength when the light is incident thereon; and
   a light-blocking pattern disposed on said reflection pattern, said light-blocking pattern comprising a pattern of material that is substantially opaque with respect to said light of a given wavelength, and said light-blocking pattern having the same size and shape as said reflection pattern.

2. The photo mask of claim 1, wherein the thickness of said reflection pattern is 60 to 200 nm.

3. The photo mask of claim 1, wherein said material of the reflection pattern is less reflective wit respect to the transverse magnetic (TM) waves of said light of a given wavelength than with respect to the transverse electric (TE) waves of said light.

4. The photo mask of claim 1, wherein said reflection pattern comprises spin-on-glass (SOG).

5. The photo mask of claim 4, wherein said transparent substrate is a quartz substrate and said light-blocking pattern comprises chrome.

6. The photo mask of claim 1, wherein said transparent substrate is a quartz substrate and said light-blocking pattern comprises chrome.

7. A method of manufacturing a photo mask for use in a photolithography process, comprising:
   determining the light source that will be used in the photolithography process such that the wavelength of the exposure light of the photolithography process is known;
   providing a substrate that will be transparent to the exposure light;
   forming a reflection pattern on the transparent substrate so that portions of the transparent substrate are exposed in correspondence with the pattern, said reflection pattern being of material that is reflective with respect to the exposure light when the light is incident thereon; and
   forming on the reflection pattern a light-blocking pattern that has the same size and shape as the reflection pattern, said light-blocking pattern being of a material that is substantially opaque with respect to the exposure light.

8. The method of claim 7, wherein the forming of the reflection pattern and the forming of the light-blocking pattern comprise:
   sequentially forming a first film and a second film on the transparent substrate;
   forming a photoresist pattern on the second material film;
   etching the second film using the photoresist pattern as an etching mask to form the light-blocking pattern;
   removing the photoresist pattern; and
   etching the first film using the light-blocking pattern as an etching mask to form the reflection pattern.

9. The method of claim 7, wherein the forming of the reflection pattern comprises forming a layer of the reflective material to a thickness on the substrate that is less than the wavelength of the exposure light.

10. The method of claim 7, wherein the forming of the reflection pattern comprises forming a layer of the reflective material to a thickness of 60 to 200 nm.

11. The method of claim 7, wherein the forming of the reflection pattern comprises forming a layer of material on the substrate that is less reflective with respect to the transverse magnetic (TM) waves of the exposure light than with respect to the transverse electric (TE) waves of said light.

12. The method of claim 11, wherein the forming of the reflection pattern comprises forming a pattern of spin-on-glass (SOG) on the substrate.

13. The method of claim 7, wherein the providing of a transparent substrate comprises providing a quartz substrate, and the forming of the light-blocking pattern comprises forming a pattern of chrome on the reflection pattern.

* * * * *